United States Patent
Qin et al.

(10) Patent No.: US 11,249,356 B2
(45) Date of Patent: Feb. 15, 2022

(54) BASE SUBSTRATE AND MANUFACTURING METHOD THEREFOR, APPARATUS, DISPLAY SUBSTRATE, AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Wei Qin, Beijing (CN); Yonggang Du, Beijing (CN); Xiangzhen Wang, Beijing (CN); Bin Wu, Beijing (CN); Guohua Xu, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 71 days.

(21) Appl. No.: 16/642,156

(22) PCT Filed: Mar. 27, 2019

(86) PCT No.: PCT/CN2019/079907
§ 371 (c)(1),
(2) Date: Feb. 26, 2020

(87) PCT Pub. No.: WO2019/184954
PCT Pub. Date: Oct. 3, 2019

(65) Prior Publication Data
US 2020/0355969 A1 Nov. 12, 2020

(30) Foreign Application Priority Data

Mar. 30, 2018 (CN) .......................... 201810290269.6

(51) Int. Cl.
*G02F 1/1362* (2006.01)
*C03B 17/06* (2006.01)
(Continued)

(52) U.S. Cl.
CPC ...... *G02F 1/136204* (2013.01); *C03B 17/064* (2013.01); *G02F 1/133514* (2013.01);
(Continued)

(58) Field of Classification Search
CPC ......... G02F 1/136204; G02F 1/133514; G02F 2202/22; C03B 17/064; H01L 27/1218; H01L 27/1262
(Continued)

(56) References Cited

U.S. PATENT DOCUMENTS

| 5,902,678 A | 5/1999 | Konda et al. |
| 2004/0197575 A1* | 10/2004 | Bocko ............... C03B 19/12 428/432 |
| 2007/0110995 A1* | 5/2007 | Liu ..................... C08J 7/044 428/323 |

FOREIGN PATENT DOCUMENTS

| CN | 1665748 A | 9/2005 |
| CN | 1780797 A | 5/2006 |

(Continued)

OTHER PUBLICATIONS

International Search Report and Written Opinion issued in corresponding International Application No. PCT/CN2019/079907, dated Jul. 4, 2019, with English language translation.
(Continued)

*Primary Examiner* — Charles S Chang
(74) *Attorney, Agent, or Firm* — McDermott Will and Emery LLP

(57) ABSTRACT

A base substrate includes a first base layer and an electrostatic resistant layer that are disposed in a stack.

7 Claims, 5 Drawing Sheets

(51) Int. Cl.
 *G02F 1/1335* (2006.01)
 *H01L 27/12* (2006.01)
(52) U.S. Cl.
 CPC ...... *H01L 27/1218* (2013.01); *H01L 27/1262* (2013.01); *G02F 2202/22* (2013.01)
(58) Field of Classification Search
 USPC .......................................................... 349/158
 See application file for complete search history.

(56) References Cited

FOREIGN PATENT DOCUMENTS

| | | |
|---|---|---|
| CN | 1917739 A | 2/2007 |
| CN | 101008680 A | 8/2007 |
| CN | 101448753 A | 6/2009 |
| CN | 108493196 A | 9/2018 |
| EP | 1553061 A1 | 7/2005 |
| JP | 2003-131009 A | 5/2003 |
| JP | 2011-187286 A | 9/2011 |

OTHER PUBLICATIONS

First Office Action issued in corresponding Chinese Application No. 201810290269.6, dated Mar. 3, 2020, with English language translation.

\* cited by examiner

BASE SUBSTRATE AND MANUFACTURING METHOD THEREFOR, APPARATUS, DISPLAY SUBSTRATE, AND DISPLAY DEVICE

CROSS-REFERENCE TO RELATED APPLICATIONS

This application is a national phase entry under 35 USC 371 of International Patent Application No. PCT/CN2019/079907 filed on Mar. 27, 2019, which claims priority and benefits of Chinese Patent Application No. 201810290269.6, filed with the Chinese Patent Office on Mar. 30, 2018, titled "A BASE SUBSTRATE AND MANUFACTURING METHOD THEREFOR, APPARATUS, DISPLAY SUBSTRATE, AND DISPLAY DEVICE", which are incorporated herein by reference in their entirety.

TECHNICAL FIELD

The present disclosure relates to the field of display technologies, and in particular, to a base substrate and a manufacturing method thereof, an apparatus, a display substrate, and a display device.

BACKGROUND

A thin film transistor liquid crystal display (TFT-LCD) includes an array substrate and a color filter substrate. In a process of manufacturing the TFT-LCD, the array substrate and the color filter substrate need to be transferred through rollers or a machine.

SUMMARY

In a first aspect, a base substrate is provided. The base substrate includes a first base layer and an electrostatic resistant layer that are disposed in a stack.

In some embodiments, a thickness of the first base layer is greater than a thickness of the electrostatic resistant layer.

In some embodiments, the electrostatic resistant layer includes a second base layer and an electrostatic resistant material dispersed in the second base layer.

In some embodiments, the electrostatic resistant material includes at least one of a conductive material or an antistatic material.

In some embodiments, the electrostatic resistant material is a light-transmitting electrostatic resistant material.

In some embodiments, the electrostatic resistant material is a light-transmitting electrostatic resistant material, and the light-transmitting electrostatic resistant material includes at least one of a conductive material or an antistatic material.

In a second aspect, a method for manufacturing a base substrate is provided. The method for manufacturing the base substrate includes: providing a base material and an electrostatic resistant material; and forming a first base layer by using at least a portion of the base material, and forming an electrostatic resistant layer at least by using the electrostatic resistant material, so that the electrostatic resistant layer and the first base layer are stacked on one another to obtain a base substrate.

In some embodiments, providing the base material and the electrostatic resistant material, includes: melting the base material, and dividing the base material melted into a first part of the base material melt and a second part of the base material melt; and adding the electrostatic resistant material into the second part of the base material melt to obtain a second part of the base material melt containing the electrostatic resistant material. Forming the first base layer by using at least a portion of the base material, and forming the electrostatic resistant layer at least by using the electrostatic resistant material, includes: forming the first base layer by using the first part of the base material melt, and forming the electrostatic resistant layer by using the second part of the base material melt containing the electrostatic resistant material.

In some embodiments, forming the first base layer by using the first part of the base material melt, and forming the electrostatic resistant layer by using the second part of the base material melt containing the electrostatic resistant material, includes: transferring the first part of the base material melt into a first overflow groove of a substrate forming mold through a first flow dividing pipe; transferring the second part of the base material melt containing the electrostatic resistant material into a second overflow groove of the substrate forming mold through a second flow dividing pipe; and forming, by the first part of the base material melt, the first base layer in a manner of overflowing from the first overflow groove, and forming, by the second part of the base material melt containing the electrostatic resistant material, the electrostatic resistant layer that is in contact the first base layer in a manner of overflowing from the second overflow groove.

In some embodiments, a volume flow rate at which the first part of the base material melt overflows from the first overflow groove is greater than a volume flow rate at which the second part of the base material melt containing the electrostatic resistant material overflows from the second overflow groove.

In some embodiments, before forming, by the first part of the base material melt, the first base layer in the manner of overflowing from the first overflow groove, the method for manufacturing the base substrate further includes: controlling a temperature of a groove wall of the first overflow groove to be less than a temperature of the first part of the base material melt.

In some embodiments, before forming, by the second part of the base material melt containing the electrostatic resistant material, the electrostatic resistant layer that is in contact with the first base layer in the manner of overflowing from the second overflow groove, the method for manufacturing the base substrate further includes: controlling a temperature of a groove wall of the second overflow groove to be less than a temperature of the second part of the base material melt containing the electrostatic resistant material.

In a third aspect, an apparatus for manufacturing a base substrate is provided. The apparatus for manufacturing the base substrate is configured to manufacturing the base substrate according to the first aspect. The apparatus for manufacturing the base substrate includes a first flow dividing pipe, a second flow dividing pipe, and a substrate forming mold that is respectively communicated with the first flow dividing pipe and the second flow dividing pipe.

In some embodiments, the apparatus for manufacturing the base substrate includes a mold body and a partition plate. At least a portion of the partition plate is disposed in a space inside the mold body. The mold body includes a first overflow groove and a second overflow groove that are separated by the portion of the partition plate disposed in the space inside the mold body. An inlet of the first overflow groove is communicated with an outlet of the first flow dividing pipe, and an inlet of the second overflow groove is communicated with an outlet of the second flow dividing pipe.

In some embodiments, an overflow outlet of the first overflow groove and an overflow outlet of the second overflow groove are in a same plane, and an end of the partition plate protrudes over the plane.

In some embodiments, the apparatus for manufacturing the base substrate further includes a main pipe and a material feeding port communicated with the main pipe. An outlet of the main pipe is respectively communicated with an inlet of the first flow dividing pipe and an inlet of the second flow dividing pipe.

In some embodiments, the apparatus for manufacturing the base substrate further includes a material mixing port communicated with the second flow dividing pipe.

In some embodiments, the apparatus for manufacturing the base substrate further includes a heater configured to heat the main pipe.

In some embodiments, the apparatus for manufacturing the base substrate further includes a material mixing port communicated with the second flow dividing pipe and a heater configured to heat the main pipe.

In some embodiments, the apparatus for manufacturing the base substrate further includes a first temperature control unit connected with a groove wall of the first overflow groove and a second temperature control unit connected with a groove wall of the second overflow groove.

In some embodiments, the apparatus for manufacturing the base substrate further includes a first flow regulating valve communicated with the first flow dividing pipe and a second flow regulating valve communicated with the second flow dividing pipe.

In a fourth aspect, a display substrate is provided. The display substrate includes the base substrate according to the first aspect.

In some embodiments, the display substrate further includes at least one functional film layer disposed at a side of the first base layer away from the electrostatic resistant layer in the base substrate.

In a fifth aspect, a display device is provided. The display apparatus includes the display substrate according to the fourth aspect.

BRIEF DESCRIPTION OF THE DRAWINGS

The accompanying drawings described herein are intended to provide a further understanding of some embodiments of the present disclosure and constitute a part of some embodiments of the present disclosure. The illustrative embodiments in the present disclosure and the description thereof be used to explain some embodiments of the present disclosure, but do not constitute an undue limitation of the present disclosure. In the accompanying drawings.

DETAILED DESCRIPTION

The technical solutions in embodiments of the present disclosure will be described clearly and completely in combination with the accompanying drawings in some embodiments of the present disclosure. Obviously, the described embodiments are merely some but not all of the embodiments of the present disclosure. All other embodiments made on the basis of some embodiments of the present disclosure by a person of ordinary skill in the art without paying any creative effort shall be included in the protection scope of the present disclosure.

In a process of transferring an array substrate, a color filter substrate or other similar display substrates through rollers or a machine, since an outer surface of the display substrate (i.e., a surface of the display substrate that is in contact with an external environment) is frequently in frictional contact with a transferring surface of the rollers or the machine, electrostatic charges are easily generated on the outer surface of the display substrate. In addition, a base or a cover plate in the display substrate is generally made of insulating glass, which causes that an amount of electrostatic charges that is generated on the outer surface of the display substrate is large, and the electrostatic charges are difficult to be effectively discharged. As a result, a use of the display substrate is adversely affected easily, such as causing damage to a functional film layer with a conductive property in the display substrate and affecting a transmission accuracy of electrical signals on the functional film layer.

Figure 1:
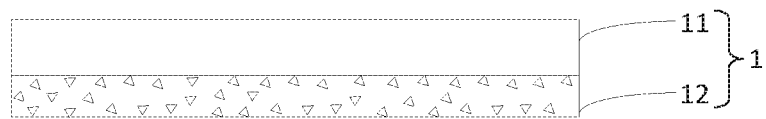
FIG. 1 is a schematic diagram showing a structure of a base substrate, according to some embodiments of the present disclosure.

Based on the above situation, some embodiments of the present disclosure provide a base substrate. As shown in FIG. 1, the base substrate 1 includes a first base layer 11 and an electrostatic resistant layer 12 that are disposed in a stack.

In a case where the base substrate 1 is applied to a display substrate, a functional film layer in the display substrate is formed above a surface of the first base layer 11 away from the electrostatic resistant layer 12. When the display substrate is transferred through rollers during a process of manufacturing the display substrate, the electrostatic resistant layer 12 of the base substrate 1 is configured to contact with the rollers. In this way, no electrostatic charge or only a small amount of electrostatic charges is generated on an outer surface of the display substrate, or the electrostatic charges generated on the outer surface of the display substrate are effectively released through the electrostatic resistant layer. Therefore, in the case where the base substrate 1 provided by some embodiments of the present disclosure is applied to the display substrate, the functional film layer in the display substrate may be prevented from being damaged by the electrostatic charges without coating a conductive film layer on the outer surface of the display substrate, thereby improving a production yield of the display substrate. In addition, the electrostatic charges may also be effectively prevented from accumulating on the display substrate through the electrostatic resistant layer 12 of the base substrate 1, and further prevented from damaging the functional film layer in the display substrate. As a result, a service life of a display device will be increased.

Figure 2:
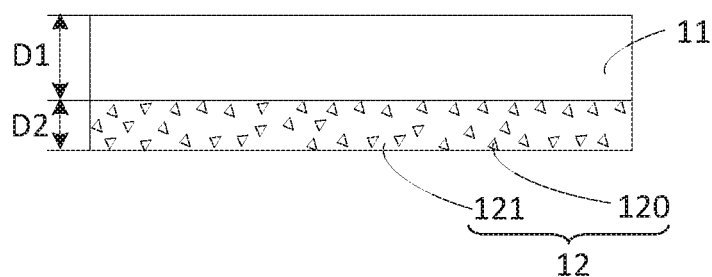
FIG. 2 is a schematic diagram showing a structure of another base substrate, according to some embodiments of the present disclosure.

It will be noted that, as shown in FIG. 2, in some embodiments of the present disclosure, a thickness D1 of the first base layer 11 is greater than a thickness D2 of the electrostatic resistant layer 12. Since the first base layer 11 is generally made of a base material with a high light transmittance, the thickness of the first base layer 11 with a high light transmittance is set to be greater than the thickness of the electrostatic resistant layer 12. In this way, a ratio of the thickness of the electrostatic resistant layer 12 to a thickness of the base substrate 1 may be reduced so as to ensure a light transmittance of the base substrate 1. In addition, the first base layer 11 is disposed in parallel with the electrostatic resistant layer 12. That is, a thickness direction of the first base layer 11 is perpendicular to a surface of the first base layer 11 facing the electrostatic resistant layer 12, and a thickness direction of the electrostatic resistant layer 12 is perpendicular to a surface of the electrostatic resistant layer 12 facing the first base layer 11.

In some embodiments of the present disclosure, the electrostatic resistant layer 12 is all or partially made of an electrostatic resistant material. Optionally, the electrostatic resistant layer 12 includes a second base layer 121 and the electrostatic resistant material 120 dispersed in the second base layer 121. A mass percentage of the electrostatic resistant material 120 in the second base layer 121 is preferably not to affect the light transmittance of the base substrate 1, and is generally within a range of 5% to 20%. In this way, on a premise of not affecting the light transmittance of the base substrate 1, not only that an usage amount of the electrostatic resistant material 120 may be reduced so as to save costs, but also that the electrostatic charges may be prevented from accumulating on the base substrate 1. The electrostatic charges generated due to contact such as friction during the process of manufacturing the display substrate may be effectively reduce through the electrostatic resistant material 120 in the second base layer 121, or the electrostatic charges generated during a process of using of the display device may be effectively reduce through the electrostatic resistant material 120 in the second base layer 121.

Typically, the electrostatic resistant material 120 is a light-transmitting electrostatic resistant material. In this way, an effect of the electrostatic resistant material 120 on the light transmittance of the base substrate 1 may be further reduced.

In some embodiments of the present disclosure, the electrostatic resistant material 120 is dispersed in the second base layer 12 in a form of particles or is dispersed in the second base layer 12 in a form of fibers. Optionally, the electrostatic resistant material 120 is a conductive material. Or, the electrostatic resistant material 120 is an antistatic material. Or, the electrostatic resistant material 120 includes both a conductive material and an antistatic material.

For example, the conductive material is at least one of indium tin oxide semi-particles, carbon fibers, and conductive graphite particles, but is not limited thereto. The antistatic material is one or two of polyvinyl chloride and polycarbonate, but is not limited thereto.

In a case where the electrostatic resistant material 120 is a conductive material, if electrostatic charges are generated on the base substrate 1, the electrostatic charges may be conducted out through the conductive material. In a case where the electrostatic resistant material 120 is an antistatic material, if the base substrate 1 has a rolling friction with the rollers in a transferring process, the electrostatic resistant material in the second base layer 121 may be used to prevent a generation of the electrostatic charges, so as to reduce or even eliminate the generation of the electrostatic charges.

Figure 3:
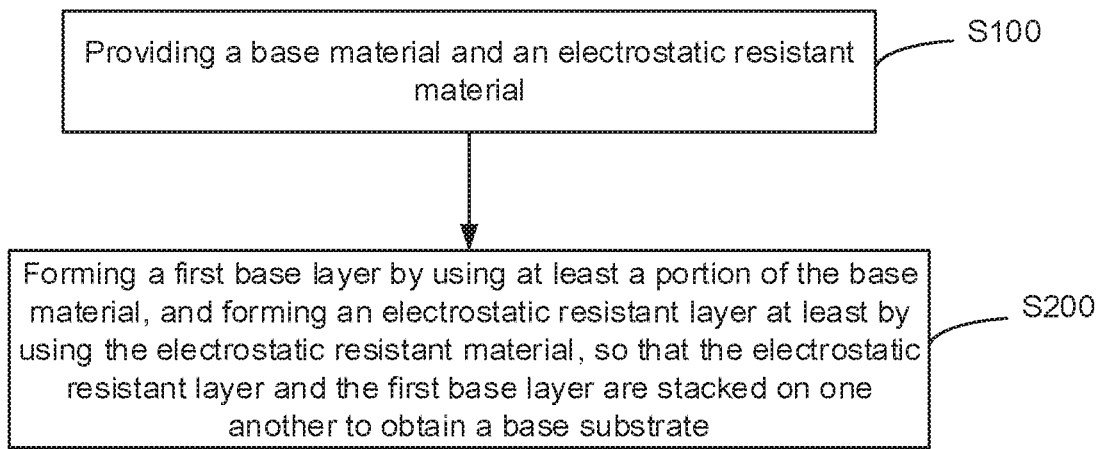
FIG. 3 is a flow diagram of a method for manufacturing a base substrate, according to some embodiments of the present disclosure.

Some embodiments of the present disclosure provide a method for manufacturing the base substrate 1. As shown in FIG. 3, the method for manufacturing the base substrate 1 includes step 100 (S100) to step 200 (S200):

S100, providing a base material and an electrostatic resistant material; and

S200, forming a first base layer 11 by using at least a portion of the base material, and forming an electrostatic resistant layer 12 at least by using the electrostatic resistant material, so that the electrostatic resistant layer 12 and the first base layer 11 are stacked on one another to obtain a base substrate 1.

Beneficial effects of the method for manufacturing the base substrate provided by some embodiments of the present disclosure are the same as beneficial effects of the base substrate 1 provided by some embodiments described above, and details are not described herein.

Figure 7:
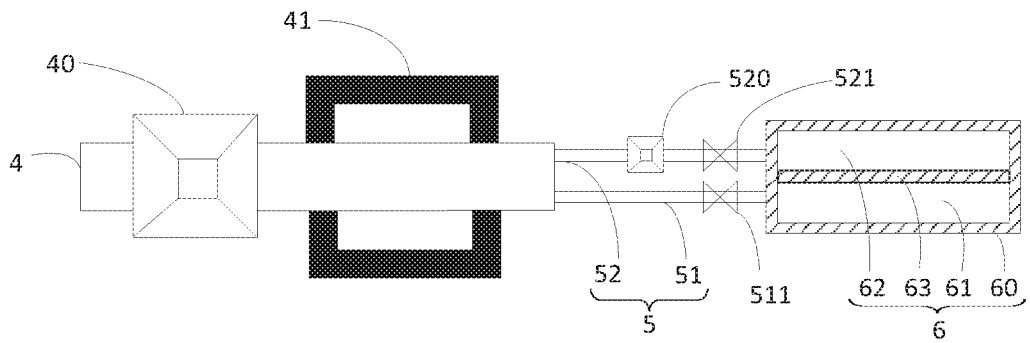
FIG. 7 is a schematic diagram showing a structure of an apparatus for manufacturing a base substrate, according to some embodiments of the present disclosure.

It will be worth mentioning that, the base substrate 1 in some embodiments of the present disclosure may be manufactured by using an overflow fusion method. For example, the base substrate 1 may be manufactured by using an apparatus for manufacturing a base substrate shown in FIG. 7. Referring to FIG. 7, the apparatus for manufacturing the base substrate is configured to manufacture the base substrate 1. The apparatus for manufacturing the base substrate includes a first flow dividing pipe 51, a second flow dividing pipe 52, and a substrate forming mold 6 that is respectively communicated with the first flow dividing pipe 51 and the second flow dividing pipe 52.

Figure 4:
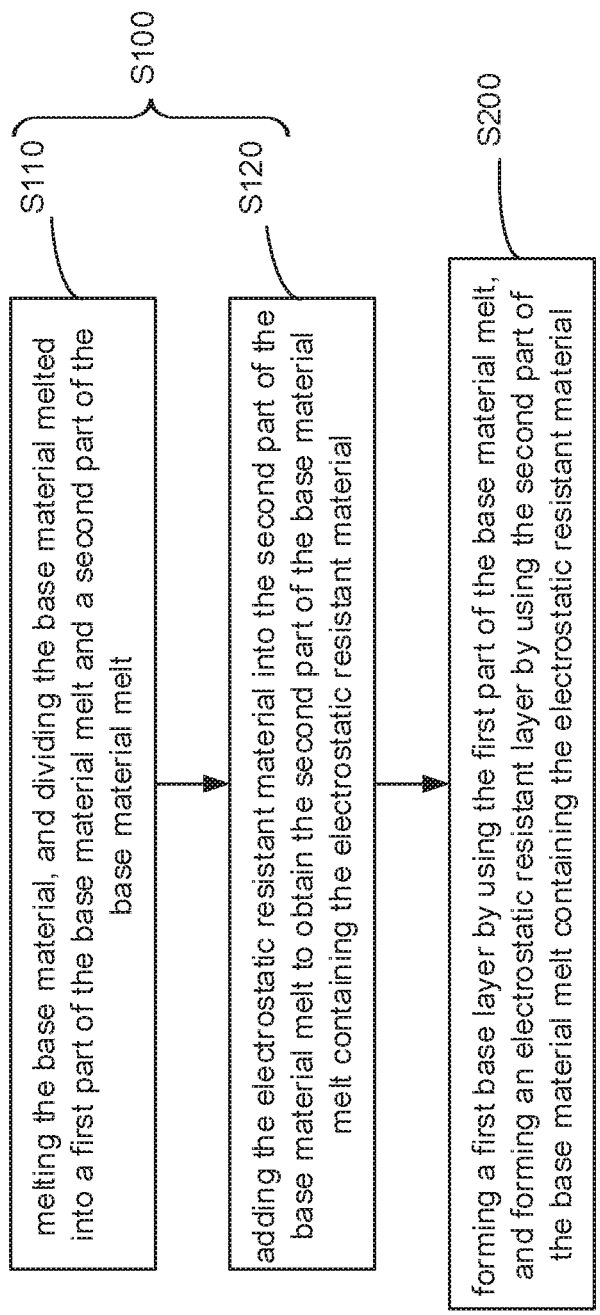
FIG. 4 is a flow diagram of another method for manufacturing a base substrate, according to some embodiments of the present disclosure.

Based on this, in some embodiments of the present disclosure, referring to FIG. 4, the step of providing the base material and the electrostatic resistant material in S100 includes step 110 (S110) to step 120 (S120):

S110, melting the base material, and dividing the base material melted into a first part of the base material melt and a second part of the base material melt; and S120, adding the electrostatic resistant material into the second part of the base material melt to obtain the second part of the base material melt containing the electrostatic resistant material.

With continuous reference to FIG. 4, the step of forming the first base layer 11 by using the base material, and forming the electrostatic resistant layer 12 by using the electrostatic resistant material in S200 includes: forming the first base layer 11 by using the first part of the base material melt, and forming the electrostatic resistant layer 12 by using the second part of the base material melt containing the electrostatic resistant material.

Figure 5:
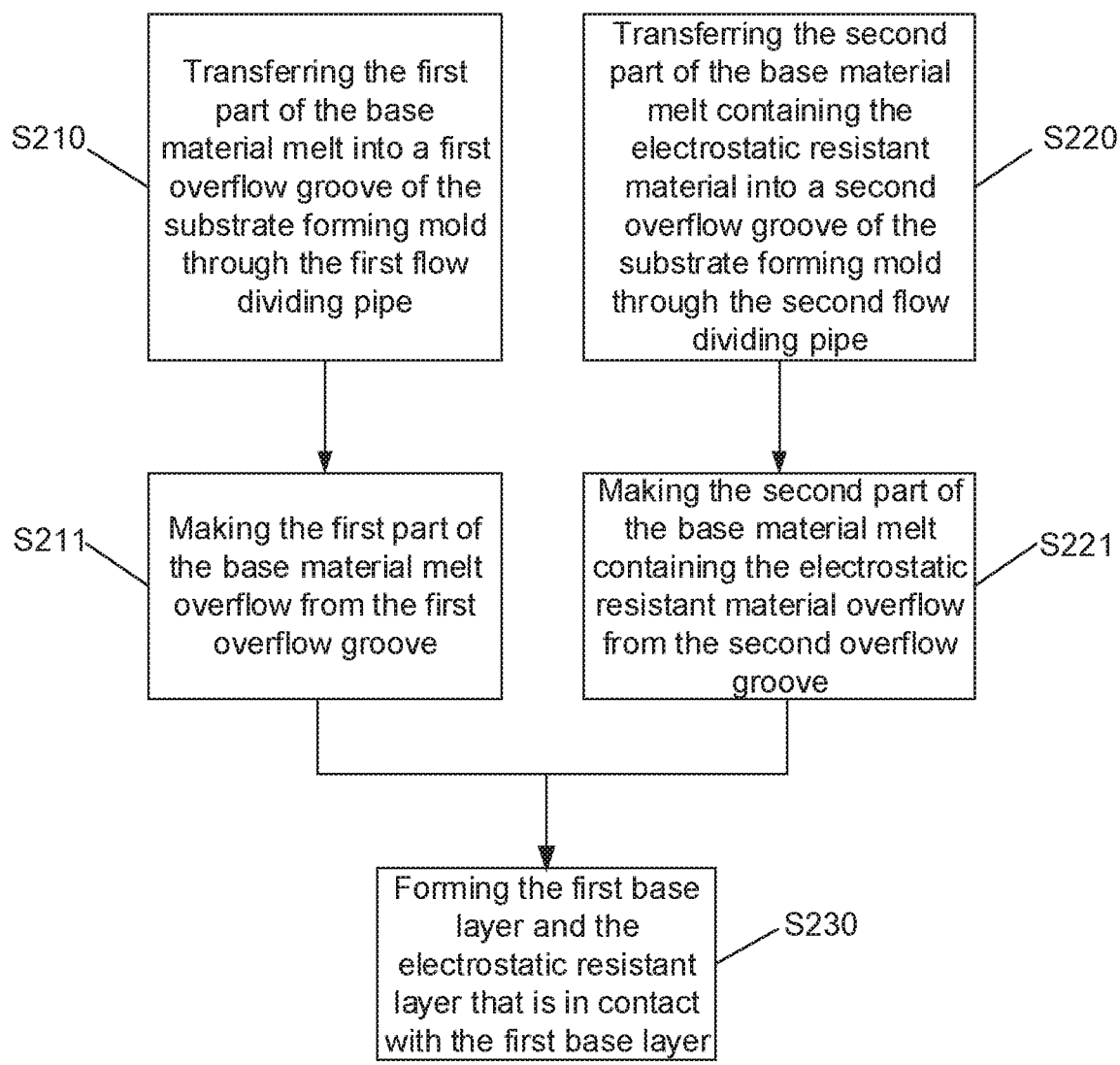
FIG. 5 is a flow diagram of yet another method for manufacturing a base substrate, according to some embodiments of the present disclosure.
Figure 8:
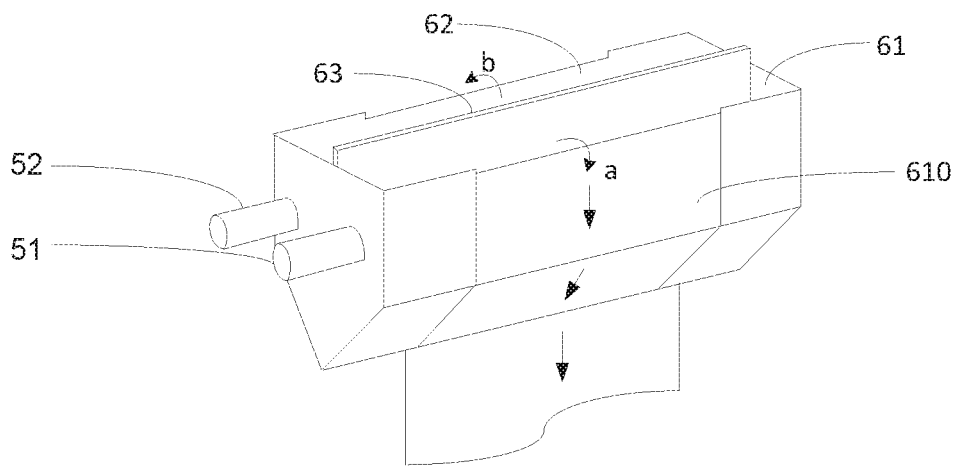
FIG. 8 is a schematic diagram showing a structure of a substrate forming mold, according to some embodiments of the present disclosure.

For example, after the first part of the base material melt and the second part of the base material melt containing the electrostatic resistant material are obtained, referring to FIGS. 5, 7 and 8, the step of forming the first base layer 11 by using the first part of the base material melt, and forming the electrostatic resistant layer 12 by using the second part of the base material melt containing the electrostatic resistant material in S200 includes step 210 (S210) to step 230 (S230):

S210, transferring the first part of the base material melt into a first overflow groove 61 of the substrate forming mold 6 through the first flow dividing pipe 51;

S211, making the first part of the base material melt overflow from the first overflow groove 61;

S220, transferring the second part of the base material melt containing the electrostatic resistant material into a second overflow groove 62 of the substrate forming mold 6 through the second flow dividing pipe 51;

S221, making the second part of the base material melt containing the electrostatic resistant material overflow from the second overflow groove 62; and S230, forming the first base layer 11 and the electrostatic resistant layer 12 that is in contact with the first base layer 11.

Here, a process from S210 to S211 and a process from S220 to S221 are independent to each other, and S211 and S221 are performed simultaneously. An overflow path a of the first part of the base material melt is shown in FIG. 8, and an overflow path b of the second part of the base material melt containing the electrostatic resistant material is shown in FIG. 8. In this way, the first part of the base material melt and the second part of the base material melt containing the electrostatic resistant material that overflow from the substrate forming mold 6 may contact at a bottom of the substrate forming mold 6 along corresponding overflow paths thereof, and form the base substrate 1.

In some embodiments of the present disclosure, a volume flow rate at which the first part of the base material melt overflows from the first overflow groove 61 is set to be greater than a volume flow rate at which the second part of the base material melt containing the electrostatic resistant material overflows from the second overflow groove 62. Here, the volume flow rate refers to a volume of fluid flowing through an overflow cross section per unit time. Since the base substrate 1 is set to be composed of the first base layer 11 and the electrostatic resistant layer 12 that are disposed in a stack, the first part of the base material melt overflowing from the first overflow groove 61 and the second part of the base material melt containing the electrostatic resistant material overflowing from the second overflow groove 62 need to contact with each other to form the base substrate 1. Therefore, areas where the first part of the base material melt overflowing the first overflow groove 61 and the second part of the base material melt containing the electrostatic resistant material overflowing the second overflow groove 62 contact each other are the same, and the volume flow rate at which the first part of the base material melt overflows from the first overflow groove 61 is controlled to be greater than the volume flow rate at which the second part of the base material melt containing the electrostatic resistant material overflows from the second overflow groove 62 may ensure that the thickness of the first base layer 11 is greater than the thickness of the electrostatic resistant layer 12, thereby ensuring the light transmittance of the base substrate 1.

It will be noted that, in a case where the second part of the base material melt containing the electrostatic resistant material contacts with the first part of the base material melt to form the base substrate 1, conductive molecules in the second part of the base material melt containing the electrostatic resistant material will easily enter the first part of the base material melt in a case of an intense thermal motion of molecules. Therefore, in some embodiments of the present disclosure, a material for forming the first base layer 11 (i.e., the first part of the base material melt) and a material for forming the electrostatic resistant layer 12 (i.e., the second part of the base material melt containing the electrostatic resistant material) are pre-cooled, which may reduce an intensity of motion of molecules in each material. Then, the material for forming the first base layer 11 and the material for forming the electrostatic resistant layer 12 are controlled to contact with each other, it is possible to avoid a molecular motion between the material of the first base layer 11 and the material of the electrostatic resistant layer 12.

Figure 6:
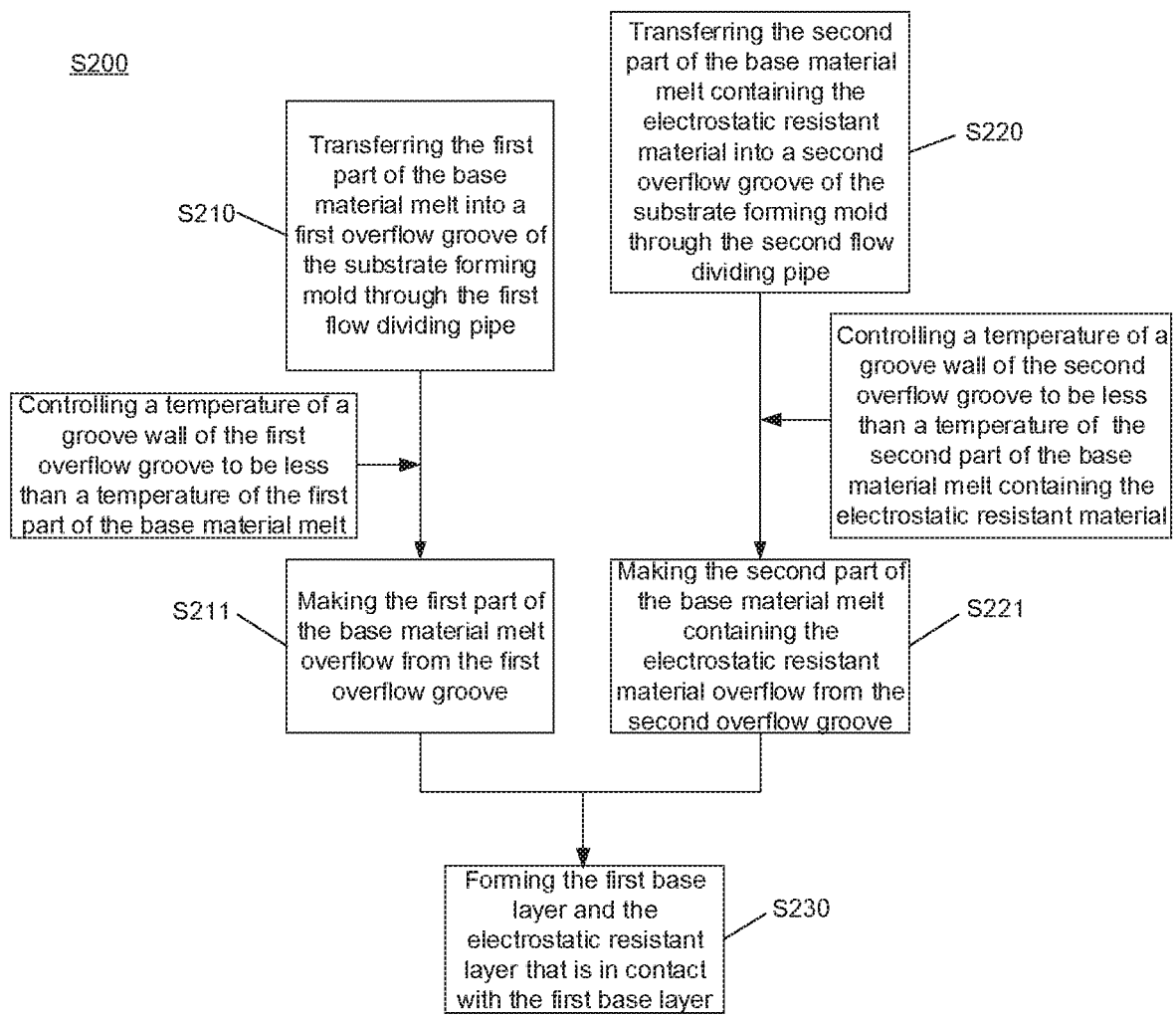
FIG. 6 is a flow diagram of yet another method for manufacturing a base substrate, according to some embodiments of the present disclosure.

Optionally, referring to FIG. 6, before forming, by the first part of the base material melt, the first base layer 11 in a manner in which the first part of the base material melt overflows from the first overflow groove 61, the method for manufacturing the base substrate further includes: controlling a temperature of a groove wall of the first overflow groove 61 to be less than a temperature of the first part of the base material melt.

Optionally, with continuous reference to FIG. 6, before forming, by the second part of the base material melt containing the electrostatic resistant material, the electrostatic resistant layer 12 that is in contact with the first base layer 11 in a manner in which the second part of the base material melt containing the electrostatic resistant material overflows from the second overflow groove 62, the method for manufacturing the base substrate further includes: controlling a temperature of a groove wall of the second overflow groove 62 to be less than a temperature of the second part of the base material melt containing the electrostatic resistant material.

It will be understood that, it is permissible to reduce either the temperature of the groove wall of the first overflow groove 61 or the temperature of the groove wall of the second overflow groove 62, or to reduce both of the temperature of the groove wall of the first overflow groove 61 and the temperature of the groove wall of the second overflow groove 62 simultaneously, as long as the electrostatic resistant material contained in the second part of the base material melt may be prevented from entering the first part of the base material melt through the thermal motion of molecules.

As shown in FIGS. 7 and 8, some embodiments of the present disclosure provide an apparatus for manufacturing a base substrate that is used to implement the method for manufacturing the base substrate provided by some embodiments described above to manufacture the base substrate 1. The apparatus for manufacturing the base substrate includes a material dividing pipeline 5 and a substrate forming mold 6 communicated with the material dividing pipeline 5. The material dividing pipeline 5 includes a first flow dividing pipe 51 and a second flow dividing pipe 52.

Optionally, as shown in FIGS. 7 and 8, the substrate forming mold 6 includes a mold body 60 and a partition plate 63. At least a portion of the partition plate 63 is disposed in a space inside the mold body 60. The mold body 60 includes a first overflow groove 61 and a second overflow groove 62 that are separated by the portion of the partition plate 63 disposed in the space inside the mold body 60. An inlet of the first overflow groove 61 is communicated with an outlet of the first flow dividing pipe 51, and an inlet of the second overflow groove 62 is communicated with an outlet of the second flow dividing pipe 52.

After the base material melt is transferred into the first overflow groove 61 of the substrate forming mold 6 through the first flow dividing pipe 51, and electrostatic resistant material melt is transferred into the second overflow groove 62 of the substrate forming mold 6 through the second flow dividing pipe 52, the base material melt may overflow to form the first base layer 11 shown in FIG. 1 by using the substrate forming mold 6, and the electrostatic resistant material melt may overflow to form the electrostatic resistant layer 12 shown in FIG. 1 by using the substrate forming mold 6, and the electrostatic resistant layer 12 is ensured to contact with the first base layer 11.

Beneficial effects of the apparatus for manufacturing the base substrate provided by some embodiments of the present disclosure are the same as the beneficial effects of the base substrate provided by some embodiments described above, and details are not described herein.

It will be noted that, as shown in FIG. 8, in some embodiments of the present disclosure, an overflow outlet of the first overflow groove 61 and an overflow outlet of the second overflow groove 62 are in a same plane. An end of the partition plate 63 protrudes over the plane. That is, the partition plate 63 protrudes over an overflow plane of the first overflow groove 61 and an overflow plane of the second overflow groove 62. Since the first overflow groove 61 and the second overflow groove 62 separated by the partition plate 63 are generally symmetrically located at both sides of the partition plate 63, in a case where an end of the partition plate 63 protrudes over the plane where the overflow outlet of the first overflow groove 61 and the overflow outlet of the second overflow groove 62 are in, the partition plate 63 may well block the melt respectively in the first overflow groove 61 and the second overflow groove 62 and the melt respectively overflowing from the overflow outlet of the first overflow groove 61 and the overflow outlet of the second overflow groove 62, thereby preventing the melt overflowing from the first overflow groove 61 and the melt overflowing from the second overflow groove 62 from mixing.

It will be understood that, in some embodiments, the first base layer 11 in the base substrate 1 is made of the first part of the base material melt, the electrostatic resistant layer 12 is made of the second part of the base material melt containing the electrostatic resistant material, and the first part of the base material melt and the second part of the base material melt are from a same base material.

Based on this, as shown in FIG. 7, in some embodiments of the present disclosure, the apparatus for manufacturing the base substrate further includes a main pipe 4 provided with a material feeding port 40. The material feeding port 40 is configured to feed the base material into the main pipe 4, and the base material is generally glass powder or the like. An outlet of the main pipe 4 is respectively communicated with an inlet of the first flow dividing pipe 51 and an inlet of the second flow dividing pipe 52. After the base material fed from the material feeding port 40 forms the base material melt in the main pipe 4, the base material melt may be divided to enter the first flow dividing pipe 51 and the second flow dividing pipe 52, Base material melt entering the first flow dividing pipe 51 is the first part of the base material melt, and base material melt entering the second flow dividing pipe 52 is the second part of the base material melt.

Optionally, as shown in FIG. 7, the apparatus for manufacturing the base substrate further includes a heater 41 provided on the main pipe 4. In this way, after the base material is fed into the main pipe 4 from the material feeding port 40, the heater 41 may heat the base material into the melt, and maintain a temperature of the base material melt in the main pipe 4 to ensure a fluidity of the base material melt. In addition, the heater 41 includes, for example, an electromagnetic heater, an infrared heater or a resistance heater, and some embodiments of the present disclosure do not limit this.

It will be added that, as shown in FIG. 7, the second flow dividing pipe 52 is provided with a material mixing port 520. In this way, in a process of transferring the second part of the base material melt through the second flow dividing pipe 52, the electrostatic resistant material may be added into the second part of the base material melt from the material mixing port 520, so that the electrostatic resistant material may be dispersed in the second part of the base material melt.

In some embodiments of the present disclosure, as shown in FIG. 8, both the groove wall of the first overflow groove 61 and the groove wall of the second overflow groove 62 in the substrate forming mold 6 are provided with a temperature control unit 610. The temperature control unit 610 may adjust a temperature of a groove wall of a corresponding overflow groove according to a temperature of the groove wall of the corresponding overflow groove and a temperature of the melt in the corresponding overflow groove, so as to ensure that the temperature of the groove wall of the corresponding overflow groove is lower than the temperature of the melt in the corresponding overflow groove, thereby effectively controlling a solidified state of the melt, i.e., reducing the thermal motion of material molecules in the melt. Further, it is possible to prevent the melt overflowing from the first overflow groove 61 and the melt overflowing from the second overflow groove 62 from mixing through the thermal motion of the molecules when the melt overflowing from the first overflow groove 61 and the melt overflowing from the second overflow groove 62 contact with each other, Optionally, the temperature control unit 610 is a temperature controller or any other temperature control device.

In some embodiments of the present disclosure, as shown in FIG. 7, the apparatus for manufacturing the base substrate further includes flow regulating valves respectively provided on the first flow dividing pipe 51 and the second flow dividing pipe 52. For example, a first flow regulating valve 511 provided on the first flow dividing pipe 51 and a second flow regulating valve 521 provided on the second flow dividing pipe 52. A flow in the first flow dividing pipe 51 is regulated through the first flow regulating valve 511, and a flow in the second flow dividing pipe 52 is regulated through the second flow regulating valve 521. In this way, a volume flow rate at which the first flow dividing pipe 51 transfers the first part of the base material melt may be contra ed to be greater than a volume flow rate at which the second flow dividing pipe 52 transfers the second part of the base material melt, thereby making it possible that the thickness of the first base layer 11 is greater than the thickness of the electrostatic resistant layer in the base substrate 1 manufactured by the apparatus for manufacturing the base substrate.

Figure 9:
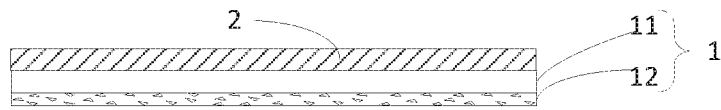
FIG. 9 is a schematic diagram showing a structure of a display substrate, according to some embodiments of the present disclosure.

Referring to FIG. 9, some embodiments of the present disclosure provide a display substrate 3 including the base substrate 1 provided by the above embodiments. For example, the display substrate is any one of a thin film transistor array substrate, a color filter substrate, a touch substrate or an organic light-emitting diode (OLED) display substrate, and of course, the display substrate may also be other display substrate, which is not listed here. Beneficial effects of the display substrate provided by some embodiments of the present disclosure are the same as the beneficial effects of the base substrate 1 in some embodiments described above, and details are not described herein.

Optionally, as shown in FIG. 9, the display substrate 3 further includes at least one functional film layer 2 disposed at a side of the first base layer 11 away from the electrostatic resistant layer 12 in the base substrate 1.

Figure 10:
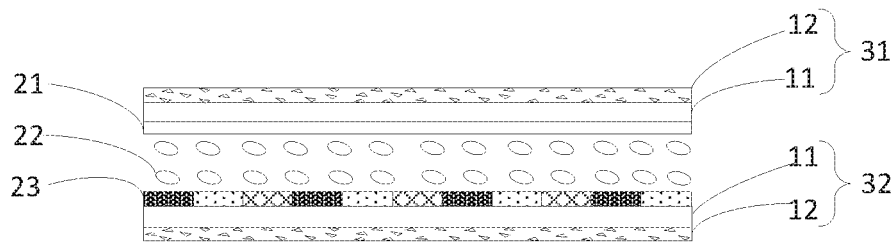
FIG. 10 is a schematic diagram showing a structure of a display panel, according to some embodiments of the present disclosure.

For example, as shown in FIG. 10, in an LCD panel, an array substrate 31 and a color filter substrate 32 are disposed opposite to each other. The array substrate 31 and the color filter substrate 32 both include the base substrate 1 provided by some embodiments described above. An electrostatic resistant layer 12 in the array substrate 31 is located on a surface of a first base layer 11 in the array substrate 31 that is away from the color filter substrate 32, and an electrode layer 21 is disposed on a side of the first base layer 11 proximate to the color filter substrate 32. An electrostatic resistant layer 12 in the color filter substrate 32 is located on a surface of a first base layer 11 in the color filter substrate 32 that is away from the array substrate 31, and a color filter layer 23 is disposed on a side of the first base layer 11 proximate to the array substrate 31. A liquid crystal layer 22 is provided between the electrode layer 21 and the color filter layer 23. Here, the electrode layer 21, the liquid crystal layer 22 and the color filter layer 23 are functional film layers having different functions.

In some embodiments of the present disclosure, by respectively providing the electrostatic resistant layer 12 in the array substrate 31 and the electrostatic resistant layer 12 in the color filter substrate 32 on surfaces of corresponding first base layers 11 that are away from the functional film layers, an outer surface of the array substrate 31 and an outer surface of the color filter substrate 32 are both surfaces of the electrostatic resistant layers 12. In this way, in a process of transferring the LCD panel, portions of the LCD panel that are in contact with the rollers are both the electrostatic resistant layers 12. Therefore, in a case where the LCD panel contacts with the rollers and has a friction with the rollers, it may be ensured that no electrostatic charge or only a small amount of electrostatic charges is generated on an outer surface of the LCD panel, or the electrostatic charges generated on the outer surface of the LCD panel are effectively released through the electrostatic resistant layers 12, thereby preventing a large amount of electrostatic charges from accumulating on the outer surface of the LCD panel, and achieving protection of functional film layers in the LCD panel by the electrostatic resistant layers 12, That is, each electrostatic resistant layer 12 has a function of shielding static electricity outside the display panel, which may prevent problems of the display panel such as an uneven display or the functional film layers in the display panel being damaged due to the static electricity from occurring.

Figure 11:
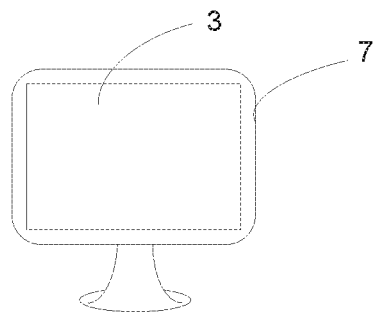
FIG. 11 is a schematic diagram showing a structure of a display device, according to some embodiments of the present disclosure.

As shown in FIG. 11, some embodiments of the disclosure provide a display device 7 including the display substrate 3 provided by some embodiments described above. Beneficial effects of the display device 7 provided by some embodiments of the present disclosure is the same as the beneficial effects of the base substrate provided by the above embodiments, which will not be described herein again. In addition, the display device provided by some embodiments of the present disclosure includes any one of a mobile phone, a tablet personal computer, a television, a display, a laptop computer, a digital photo frame, a navigator or any other product or component having a display function.

In the description of the above embodiments, specific features, structures, materials or characteristics may be combined in an appropriate manner in any one or more embodiments or examples.

The foregoing descriptions are merely specific implementation manners of the present disclosure, but the protection scope of the present disclosure is not limited thereto. The changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. A method for manufacturing a base substrate, comprising:
    providing a base material and an electrostatic resistant material; and
    forming a first base layer by using at least a portion of the base material, and forming an electrostatic resistant layer at least by using the electrostatic resistant material, so that the electrostatic resistant layer and the first base layer are stacked on one another to obtain a base substrate; wherein
    providing the base material and the electrostatic resistant material, includes:
    melting the base material, and dividing the base material melted into a first part of the base material melt and a second part of the base material melt; and
    adding the electrostatic resistant material into the second part of the base material melt to obtain the second part of the base material melt containing the electrostatic resistant material; and
    forming the first base layer by using at least a portion of the base material, and forming the electrostatic resistant layer at least by using the electrostatic resistant material, includes:
    transferring the first part of the base material melt into a first overflow groove of a substrate forming mold through a first flow dividing pipe;
    transferring the second part of the base material melt containing the electrostatic resistant material into a second overflow groove of the substrate forming mold through a second flow dividing pipe; and
    forming, by the first part of the base material melt, the first base layer in a manner of overflowing from the first overflow groove, and forming, by the second part of the base material melt containing the electrostatic resistant material, the electrostatic resistant layer that is in contact with the first base layer in a manner of overflowing from the second overflow groove;
    the method for manufacturing the base substrate, further comprising at least one of the following:
    before forming, by the first part of the base material melt, the first base layer in the manner of overflowing from the first overflow groove,
    controlling a temperature of a groove wall of the first overflow groove to be less than a temperature of the first part of the base material melt; or
    before forming, by the second part of the base material melt containing the electrostatic resistant material, the electrostatic resistant layer that is in contact with the first base layer in the manner of overflowing from the second overflow groove,
    controlling a temperature of a groove wall of the second overflow groove to be less than a temperature of the second part of the base material melt containing the electrostatic resistant material.

2. The method for manufacturing the base substrate according to claim 1, wherein a volume flow rate at which the first part of the base material melt overflows from the first overflow groove is greater than a volume flow rate at which the second part of the base material melt containing the electrostatic resistant material overflows from the second overflow groove.

3. An apparatus for manufacturing a base substrate, the apparatus for manufacturing the base substrate comprising:
   a first flow dividing pipe;
   a second flow dividing pipe; and
   a substrate forming mold that is respectively communicated with the first flow dividing pipe and the second flow dividing pipe; wherein
   the substrate forming mold includes a mold body and a partition plate; wherein
   at least a portion of the partition plate is disposed in a space inside the mold body;
   the mold body includes a first overflow groove and a second overflow groove that are separated by the portion of the partition plate disposed in the space inside the mold body; and
   an inlet of the first overflow groove is communicated with an outlet of the first flow dividing pipe, and an inlet of the second overflow groove is communicated with an outlet of the second flow dividing pipe;
   the apparatus for manufacturing the base substrate, further comprising:
   a first temperature control unit connected with a groove wall of the first overflow groove, and
   a second temperature control unit connected with a groove wall of the second overflow groove.

4. The apparatus for manufacturing the base substrate according to claim 3, wherein an overflow outlet of the first overflow groove and an overflow outlet of the second overflow groove are in a same plane, and an end of the partition plate protrudes over the plane.

5. The apparatus for manufacturing the base substrate according to claim 3, further comprising a main pipe and a material feeding port communicated with the main pipe, wherein an outlet of the main pipe is respectively communicated with an inlet of the first flow dividing pipe and an inlet of the second flow dividing pipe.

6. The apparatus for manufacturing the base substrate according to claim 5, further comprising at least one of the following:
   a material mixing port communicated with the second flow dividing pipe; or
   a heater configured to heat the main pipe.

7. The apparatus for manufacturing the base substrate according to claim 3, further comprising:
   a first flow regulating valve communicated with the first flow dividing pipe, and
   a second flow regulating valve communicated with the second flow dividing pipe.

* * * * *